(12) United States Patent
Gyoda

(10) Patent No.: US 6,187,616 B1
(45) Date of Patent: Feb. 13, 2001

(54) METHOD FOR FABRICATING SEMICONDUCTOR DEVICE AND HEAT TREATMENT APPARATUS

(75) Inventor: Kozo Gyoda, Chino (JP)

(73) Assignee: Seiko Epson Corporation, Tokyo (JP)

( * ) Notice: Under 35 U.S.C. 154(b), the term of this patent shall be extended for 0 days.

(21) Appl. No.: 09/402,891

(22) PCT Filed: Feb. 9, 1999

(86) PCT No.: PCT/JP99/00558
§ 371 Date: Oct. 13, 1999
§ 102(e) Date: Oct. 13, 1999

(87) PCT Pub. No.: WO99/41777
PCT Pub. Date: Aug. 19, 1999

(30) Foreign Application Priority Data

Feb. 13, 1998 (JP) .................................................. 10-031586
Feb. 19, 1998 (JP) .................................................. 10-037757

(51) Int. Cl.[7] ............................. H01L 21/00; H01L 21/84
(52) U.S. Cl. ........................ 438/160; 438/151; 438/166; 438/799; 438/928
(58) Field of Search .................................. 438/149, 150, 438/151, 152, 153, 154, 155, 156, 157, 158, 159, 160, 473, 535, 795, 796, 797, 798, 799, 800, 928

(56) References Cited

U.S. PATENT DOCUMENTS

| | | | |
|---|---|---|---|
| 5,254,207 | * 10/1993 | Nishizawa et al. | 156/601 |
| 5,424,244 | * 6/1995 | Zhang et al. | 437/173 |
| 5,614,447 | * 3/1997 | Yamaga et al. | 437/247 |
| 5,817,548 | * 10/1998 | Noguchi et al. | 438/160 |
| 5,891,764 | * 4/1999 | Ishihara et al. | 438/151 |
| 5,966,594 | * 10/1999 | Adachi et al. | 438/151 |
| 6,051,453 | * 4/2000 | Takemura | 438/166 |

FOREIGN PATENT DOCUMENTS

| | | |
|---|---|---|
| 60-45012 | 3/1985 | (JP) . |
| 60-223112 | 11/1985 | (JP) . |

* cited by examiner

*Primary Examiner*—John F. Niebling
*Assistant Examiner*—Viktor Simkovic
(74) *Attorney, Agent, or Firm*—Oliff & Berridge, PLC (57) ABSTRACT

In order to provide a method for fabricating semiconductor devices and a heat treatment apparatus in which stable annealing can be performed without causing harmful effects such as thermal stresses on an insulating substrate and the surface of a semiconductor thin film formed on the insulating substrate, in a heat treatment method for a substrate provided with an amorphous silicon film in the heating step, the substrate is preheated by irradiating the substrate from the side of one surface of the substrate with intermediate infrared rays having a wavelength band of 2.5 to 5 $\mu$m, and then, in the heat-treating step, the amorphous silicon film is annealed for crystallization at temperatures between 800 to 1,000° C. by irradiating the substrate from the side of the other surface of the substrate with near infrared rays having a wavelength band of 2.5 $\mu$m or less.

17 Claims, 8 Drawing Sheets

METHOD FOR FABRICATING SEMICONDUCTOR DEVICE AND HEAT TREATMENT APPARATUS

BACKGROUND OF THE INVENTION

1. Technical Field

The present invention relates to a method for fabricating semiconductor devices and heat treatment apparatuses. More particularly, the invention relates to a technique that is suitable for heat treatment in the fabrication process of an active matrix substrate in which pixel electrodes are driven by thin film transistors (hereinafter referred to as TFTs).

2. Description of the Related Art

Substrates provided with TFTs include, for example, an active matrix substrate used in a liquid crystal device (liquid crystal panel) as an electro-optical device. In the active matrix substrate, pixel electrodes are arranged in a matrix on a non-alkaline glass substrate as an insulating substrate, a TFT formed of a polysilicon thin film or the like is connected to each pixel electrode, and the liquid crystal is driven by applying a voltage to each pixel electrode through the TFT.

When such an active matrix substrate is fabricated, a semiconductor thin film is formed on a non-alkaline glass substrate in a given pattern, and by using the semiconductor thin film, active elements such as TFTs and diodes or passive elements such as resistors and capacitors are formed. During the formation of the semiconductor thin film such as silicon (Si), since factors that inhibit electrical characteristics of the electrical elements (lattice defects, radiation damage, internal strain, etc.) occur in the Si film or the like, various types of heat treatment (annealing) are performed in order to decrease the defects.

In such annealing, by heating the Si film or the like having the defects as described above up to a relatively high temperature, defect repairs (for example, disappearance of atomic holes or shift of dislocation into a stable state), or activation of impurities (for example, an increase in proportions of the injection ions that function as donors or acceptors) are achieved.

When annealing as described above is performed, an annealing furnace is conventionally used (furnace annealing). However, in such furnace annealing, since extended periods of time (for example, several hours depending on the conditions) are required for treatment, by heating (at a temperature of 500° C. or more, or 700° C. or more), warpage may occur in glass substrates having poor heat resistance, or impurities may diffuse excessively in a semiconductor film, resulting in deterioration in device characteristics. Therefore, particularly, in a low temperature process in which low temperatures are required for treatment, it has been difficult to employ furnace annealing as an annealing method when TFTs or the like are formed from a polysilicon film.

Accordingly, recently, various types of low temperature annealing and rapid thermal annealing, which are applicable to the formation of TFTs or the like using polysilicon formed by a low temperature process were developed. Among low temperature annealing and rapid thermal annealing methods, a laser annealing method has been widely used as a heating means to crystallize silicon films and to activate impurities in the case of forming polysilicon TFTs by a low temperature process.

The laser annealing method is adopted, for example, as a heat treatment or the like, in which beams of an excimer laser using XeCl, KrF, or the like are focused linearly by an optical system, and by irradiating an amorphous silicon (a-Si: amorphous silicon) film or the like formed on a glass substrate with the linear beams, the amorphous silicon film is fused instantaneously and the amorphous silicon film is crystallized to a polysilicon (Poly-Si:polycrystalline silicon) film.

Conventionally, in a heat treatment apparatus such as a heat treatment furnace, a substrate is placed on a table composed of silica glass or the like disposed in the heat treatment furnace when annealing is performed.

However, in recent years, as there is strong demand for performance improvements such as high definition in liquid crystal panels and the like, the problem of thermal stresses in semiconductor thin films caused by laser annealing of active matrix substrates is appearing.

That is, in view of improvements in characteristics such as responsiveness of liquid crystal panels, further improvements in switching characteristics of TFTs (i.e., on-off characteristics of n-channels or p-channels) are expected, and the quality of crystallinity of polysilicon or the like included in TFTs is important for improvements in switching characteristics. For example, when an amorphous silicon film is deposited at a thickness of 500 angstroms on a non-alkaline glass substrate by a low pressure chemical vapor deposition (LPCVD) system, and then the amorphous silicon film is crystallized into a polysilicon film by irradiating the amorphous silicon film with an excimer laser and instantaneously heated, the silicon film is preferably crystallized into polycrystalline silicon at a rate of 90% or more. However, in the known laser annealing method, after the amorphous silicon film irradiated with an excimer laser and is heated instantaneously (e.g., for several tens of nanoseconds) up to approximately 1,000° C., it is instantaneously cooled down to room temperature. Therefore, thermal stresses occur in the crystallized polysilicon film, and because of crystal defects or the like caused by the thermal stresses, polycrystalline silicon fail to achieve a sufficient crystallization rate.

Figure 9:
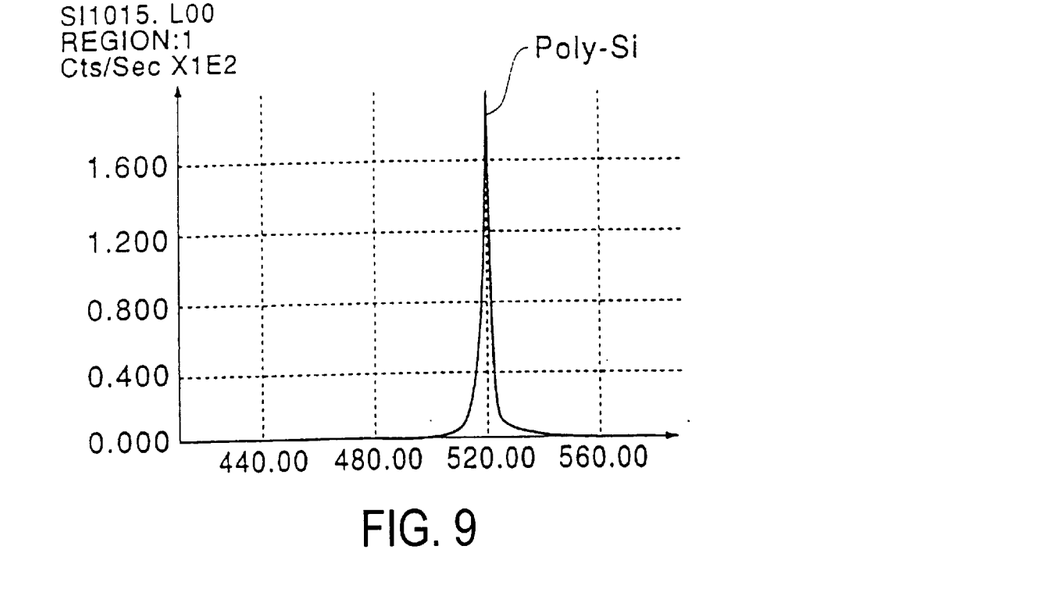
FIG. 9 is a graph which shows the analysis results of a normally crystallized polysilicon film by means of Raman spectroscopy.
Figure 10:
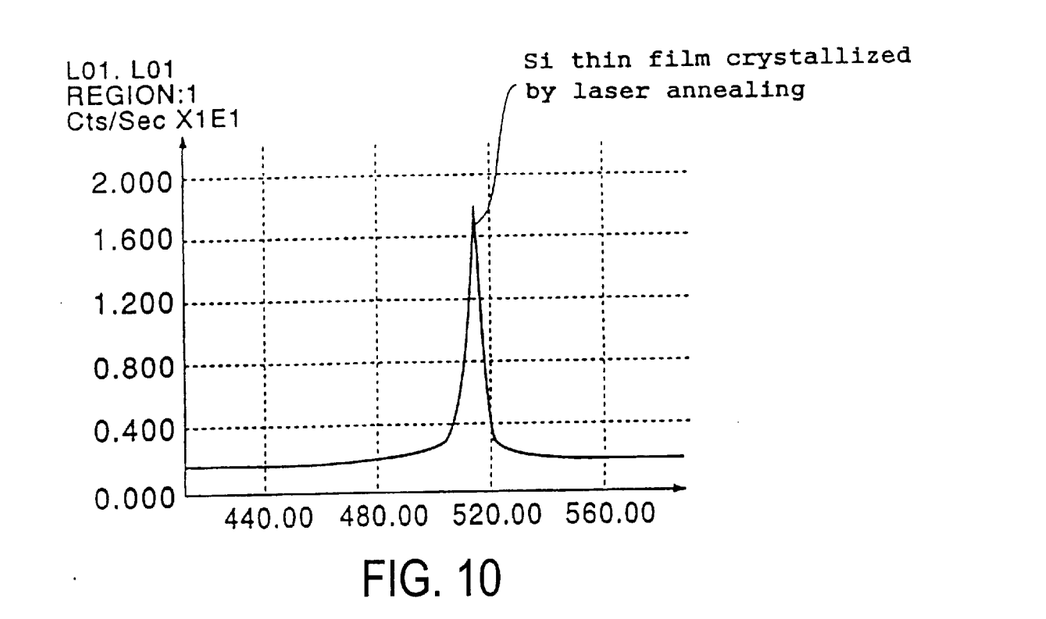
FIG. 10 is a graph which shows the analysis results of a polysilicon film, by means of Raman spectroscopy, which has been crystallized by heat treatment using a laser annealing method.

The problem described above will be described in detail with reference to FIGS. 9 and 10. FIG. 9 is a graph which shows the analysis results of a normally crystallized polysilicon film by means of Raman spectroscopy. FIG. 10 is a graph which shows the analysis results of a polysilicon film, by means of Raman spectroscopy, which has been crystallized by heat treatment using a conventional laser annealing method.

As is clear from the drawings, the normally crystallized polysilicon (Poly-Si) has a Raman spectrum peak at a wavelength of 520.00 ($cm^{-1}$), as shown in FIG. 9. In contrast, in the polysilicon film which has been crystallized by heat treatment using the conventional laser annealing method, the Raman spectrum peak is shifted from 520.00 ($cm^{-1}$) to a shorter wavelength, as shown in FIG. 10. Presumably, since shrinkage occurs in the polysilicon film due to thermal stresses during laser annealing, resulting in defects in the polycrystalline silicon, the crystallization rate from the amorphous silicon to the polysilicon decreases. That is, it is believed that in the conventional laser annealing method, since high-density energy is locally applied for a short time, strains such as shrinkage occur in the polysilicon film during cooling.

In particular, in the laser annealing method used when an active matrix substrate is fabricated, as described above, excimer laser beams are focused linearly by an optical system for radiation, and in order to perform annealing of the entire substrate, the substrate is placed on, for example, a belt conveyor or roller, and is moved at predetermined timing in relation to the irradiation beams, or the beams are moved in relation to the substrate placed on a table. Accordingly, thermal stresses caused in the polysilicon film on the substrate also occur linearly along the irradiation beams. Therefore, linear stripes appear on the polysilicon film on the substrate, and warpage occurs in the entire substrate under the influence of the stresses generated linearly, which is greatly disadvantageous.

On the other hand, a lamp annealing method has been investigated as a low temperature annealing method or rapid thermal annealing method in which a halogen lamp is used instead of laser beams.

In the lamp annealing method, by irradiating a silicon film with energy beams for several seconds to several tens of seconds using a lamp which emits irradiation light having a specific wavelength that is absorbed by the silicon film, the temperature is raised to achieve defect repairs or activation of impurities. When an active matrix substrate is heat-treated by the lamp annealing method, since the heating time is short, there are advantages such as no heat damage to the glass substrate. However, in the lamp annealing method, an extreme temperature difference occurs due to a difference in density of an amorphous silicon film on the glass substrate, and significantly large film strains remain. Thus, there may be a serious problem such as cracking of the glass substrate itself. Consequently, the application to the commercial production of low temperature process polysilicon TFTs or the like has not yet been successful.

In the conventional heat treatment apparatuses, since furnaces are heated to high temperatures, strains or deformations easily occur on the surface of a table composed of silica glass. The strains or deformations on the table and heat directly transferred from the table result in deformations such as warpage in substrates placed on the table, which is very disadvantageous. In particular, since non-alkaline glass substrates have poor heat resistance, large warpage or deformation is easily caused at a temperature of approximately 650° C. by the heat transferred from the table, resulting in a significant decrease in non-defective substrate rate.

SUMMARY OF THE INVENTION

The present invention has been made as a result of examinations in view of the problems described above. It is an object of the present invention to provide a method for fabricating semiconductor devices and a heat treatment apparatus in which stable annealing can be performed without causing harmful effects such as thermal stresses to insulating substrates and the surface of semiconductor thin films formed on the insulating substrates.

It is another object of the present invention to provide a method for fabricating semiconductor devices and a heat treatment apparatus in which substrates can be effectively prevented from being warped or deformed due to heat by blocking heat transfer to the substrates from a table for placing the substrates.

In order to achieve the objects described above, in accordance with the present invention, a method for fabricating semiconductor devices which is formed by a heat-treating process of a thin film provided on a substrate, includes at least the step of heating the substrate by irradiating the substrate from the side of one surface of the substrate with intermediate infrared rays having a wavelength band of 2.5 $\mu$m to 5 $\mu$m, and the step of heat-treating the thin film by irradiating the substrate from the side of the other surface of the substrate with near infrared rays having a wavelength band of 2.5 $\mu$m or less.

In the present invention, the heating temperature in the heating step is preferably in a range from 300° C. to 450° C. The heating temperature in the heat-treating step is preferably in a range from 800° C. to 1,000° C.

In accordance with the present invention, after a substrate is preheated under the given conditions in the heating step, annealing is performed to a thin film in the heat-treating step. Consequently, for example, when an amorphous silicon film deposited on a non-alkaline glass substrate is crystallized into a polysilicon film by the heat treatment in accordance with the present invention, because of the preheat effect on the substrate in the heating step, thermal stresses can be prevented from occurring in the annealed polysilicon film. That is, by heating the substrate in the heating step to preheat the substrate, even if the polysilicon film is heat-treated in the heat-treating step, thermal stresses can be prevented from occurring in the polysilicon film. Therefore, since crystal defects or the like resulting from thermal stresses do not occur, the crystallization rate from the amorphous silicon film into the polysilicon film can be increased. Since thermal stresses do not remain in the polysilicon film, the glass substrate is not warped or cracked. Therefore, the yield of active matrix substrates can be increased.

In the present invention, in the heat-treating step, for example, the near infrared rays may be focused by a given optical system for radiation onto the substrate and the substrate may be relatively moved at a given velocity. In the heat-treating step, for example, the near infrared rays may be collimated by a given optical system for radiation onto the substrate and the substrate may be relatively moved at a given velocity. In such a configuration, heat treatment onto the substrate or the semiconductor thin film formed on the substrate can be performed uniformly.

In the present invention, in the heat-treating step, the near infrared rays may be collimated by a given optical system and radiation may be performed collectively on substantially the entire region of the thin film formed on the substrate.

In the present invention, in the heat-treating step, preferably, by using a light source which can change wavelengths of the near infrared rays in a range of from 1 $\mu$m to 2 $\mu$m, heat treatment of the substrate or the semiconductor thin film formed on the substrate is performed much more uniformly.

Such a control of the wavelength of the near infrared rays in the heat-treating step can be achieved, for example, by changing the frequency of current applied to the light source.

In the present invention, in the heat-treating step, preferably, instead of the control of the wavelength of the near infrared rays, or in addition to the control of the wavelength of the near infrared rays, by changing the electric power applied to the light source for the near infrared rays, the intensity of irradiation of the near infrared rays to the substrate is controlled.

In the present invention, methods of controlling the intensity of irradiation of the near infrared rays include a method of changing a relative distance between the light source of the near infrared rays and the substrate, a method of scattering or reflecting the near infrared rays being directed toward the substrate from the light source of the near infrared rays, a method of changing the angle of reflection of a reflecting mirror disposed for the near infrared rays being directed from the light source of the near infrared rays to the substrate, or a method of attenuating the near infrared rays being directed from the light source of the near infrared rays to the substrate.

In the present invention, in the heat-treating step, the intensity of irradiation of the near infrared rays on the substrate may be controlled by another method, that is, by disposing an optical path wavelength filter between the light source and the substrate and by continuously changing the transmission range of the near infrared rays in the wavelength filter. In such a case, in the heat-treating step, as a wavelength filter, a slit composed of quartz may be used, and by continuously changing the width of the quartz slit in which the near infrared rays are transmittable, the intensity of irradiation of the near infrared rays on the substrate can be controlled.

In the present invention, at least one of the heating step and the heat-treating step is preferably performed in the condition that the substrate is separated at a given distance from the surface of the table for placing the substrate. In this way, since the heating step and the heat-treating step are performed with the substrate being separated from the surface of the table at a given distance, the substrate is not affected by the strains or deformations of the table. Additionally, since heat is not directly transferred from the surface of the table to the substrate itself in the heating step and the heat-treating step, the substrate is securely prevented from being warped or deformed due to high temperatures.

In the method for fabricating semiconductor devices as described above, the substrate is, for example, a non-alkaline glass substrate, and the semiconductor thin film is, for example, an amorphous silicon thin film.

In accordance with the present invention, a heat treatment apparatus for heat-treating a thin film formed on a substrate includes at least a heating means for heating the substrate by irradiating the substrate from the side of one surface of the substrate with intermediate infrared rays having a wavelength band of 2.5 $\mu$m to 5 $\mu$m and a heat-treating means for heat-treating the thin film by irradiating the substrate from the side of the other surface of the substrate with near infrared rays having a wavelength band of 2.5 $\mu$m or less.

In the present invention, a transfer means may be further provided for transferring the substrate from the position in which heating is performed by the heating means to the position in which heating is performed by the heat-treating means.

In the present invention, the heating means may heat the substrate to a temperature between 300° C. and 450° C., and the heat-treating means may heat the substrate or the thin film to a temperature between 80° C. and 1,000° C.

In the present invention, the heating means includes, for example, an intermediate infrared lamp as a light source for emitting intermediate infrared rays, and the heat-treating means includes, for example, a near infrared lamp as a light source for emitting near infrared rays.

In such a heating apparatus, the heating means heats the substrate to approximately 350° C. by intermediate infrared rays emitted from the intermediate infrared lamp, the heat-treating means heats the substrate or the conductor thin film to temperatures between 800° C. and 1,000° C. by near infrared rays emitted at a power of 7,500 W from the near infrared lamp as the light source for emitting near infrared rays, and the transfer means transfers the substrate at a velocity of 2.5 mm/sec. When the semiconductor thin film is subjected to heat treatment under the conditions as described above, thermal stresses can be securely prevented from occurring in the annealed semiconductor thin film (e.g., a polysilicon film). Therefore, since crystal defects or the like caused by thermal stresses can be prevented from occurring, the crystallization rate from the amorphous silicon film into the polysilicon film can be increased. Since thermal stresses do not remain in the polysilicon film, the glass substrate can be effectively prevented from being warped or cracked, resulting in an increase in the yield of active matrix substrates.

In the present invention, the heat-treating means preferably includes a light source for near infrared rays which can change the wavelength of the near infrared rays in a range of from 1 $\mu$m to 2 $\mu$m.

In the present invention, the heat-treating means preferably controls the wavelength of the near infrared rays by changing the frequency of current applied to the light source for the near infrared rays.

Moreover, in the present invention, the heat-treating means preferably includes a means for changing the intensity of irradiation of the near infrared rays. For example, the intensity of irradiation of the near infrared rays is preferably controlled in a range of from 25% of the maximum intensity of irradiation to 100%.

In the present invention, the following structures may be employed for controlling the intensity of irradiation of the near infrared rays to the substrate, for example, a structure for changing an electric power applied to the light source for the near infrared rays, a structure for changing a relative distance between the light source of the near infrared rays and the substrate, a structure for scattering or reflecting the near infrared rays being directed from the light source of the near infrared rays to the substrate, a structure for changing the angle of reflection of a reflecting mirror disposed for the near infrared rays being directed from the light source of the near infrared rays to the substrate, or a structure for attenuating the near infrared rays being directed from the light source of near infrared rays to the substrate.

Additionally, a structure for controlling the intensity of irradiation of the near infrared rays to the substrate by continuously changing the transmission range of the near infrared rays in a wavelength filter disposed in the middle of an optical path from the light source of the near infrared rays to the substrate may be employed. In such a case, the heat-treating means controls the intensity of irradiation of the near infrared rays onto the substrate, in a quartz slit used as the wavelength filter, by continuously changing the width of the slit in which the near infrared rays are transmittable.

In the present invention, preferably, a substrate-spacing means for securing a given distance between the substrate and the surface of a table for placing the substrate is further provided. In such a structure, since the substrate is separated from the surface of the table at a given distance, the substrate is not affected by the strains or deformations of the table. Additionally, since heat is not directly transferred from the surface of the table to the substrate itself, the substrate is effectively prevented from being warped or deformed due to high temperatures.

In the present invention, as the substrate-spacing means, for example, a plurality of heat-resistant spacers disposed on the surface of the table may be used, and the heat-resistant spacers are preferably composed of a ceramic. In such a structure, the substrate can be separated from the surface of the table inexpensively, and the substrate can be prevented from being contaminated with impurities.

In the present invention, the substrate-spacing means is preferably provided with a gas lifting unit for lifting the substrate by jetting a gas. In the gas lifting unit, a plurality of gas nozzles are formed on the surface of the table, and the substrate is lifted up by jetting a gas having a predetermined pressure from the gas nozzles. In such a structure, since heat treatment is performed in the condition that the substrate is being lifted by the gas jetted from the table side, the substrate is not affected by the strains or deformations of the table. Additionally, since heat is not directly transferred from the surface of the table to the substrate itself, the substrate is effectively prevented from being warped or deformed due to high temperatures.

In such a gas lifting unit, an inert gas, nitrogen gas, water vapor gas, or the like is jetted from the gas nozzles.

In the present invention, preferably, a gas guidance means for guiding the gas jetted from the gas nozzles to the surface of the substrate is further provided. In such a structure, when the jetted gas is an inert gas or $N_2$ gas, the oxidation of the surface of the substrate or the semiconductor thin film can be prevented, and when the jetted gas is water vapor gas, an oxide film can be formed on the surface of the substrate or semiconductor thin film.

As the gas guidance means, a guide vane for guiding a gas jetted from the ends of the substrate to the surface of the substrate is preferably used. In such a structure, the gas jetted can be guided to the surface side of the semiconductor film, inexpensively.

The substrate which is treated by the heat treatment apparatus as described above is, for example, a non-alkaline glass substrate, and the semiconductor thin film formed on the substrate is, for example, an amorphous silicon thin film.

DETAILED DESCRIPTION OF PREFERRED EMBODIMENT

The preferred embodiments of the present invention will be described with reference to the drawings.

Embodiment 1

Figure 1A:
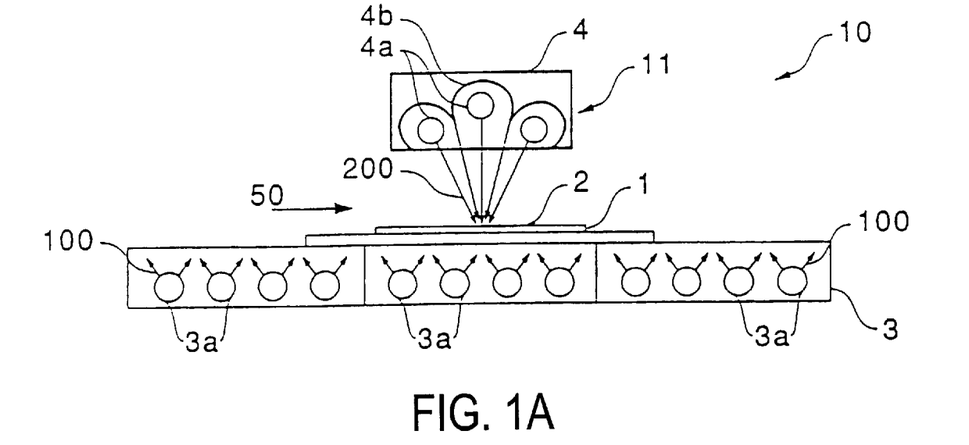
FIGS. 1(a) and 1(b) are a schematic diagram of a heat treatment apparatus used for performing a heat-treating method in accordance with a first embodiment of the present invention, and a graph which shows a relationship between the heating temperature and time in the heat treatment apparatus, respectively.
Figure 1B:
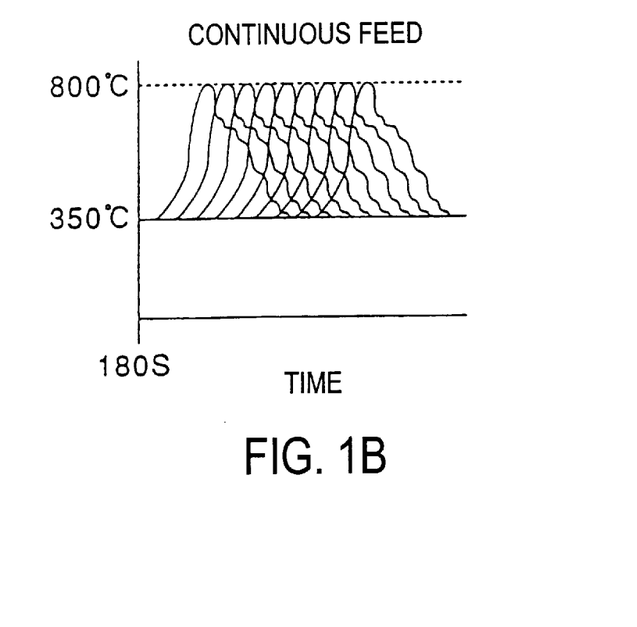

FIG. 1(a) is a diagram which shows a method for fabricating semiconductor devices in accordance with the present invention. Specifically, it is a schematic diagram which shows, as a first embodiment, a method for heat-treating a thin film formed on a substrate and a heat treatment apparatus used for it, and FIG. 1(b) is a graph which shows a relationship between the heating temperature and time in the heat treatment apparatus.

In FIG. 1, on a non-alkaline glass substrate (hereinafter referred to as "substrate") as an insulating substrate 1, a semiconductor thin film composed of an amorphous silicon film 2 as a thin film is formed. As the substrate 1, for example, OA-2 (manufactured by Nippon Electric Glass Co., Ltd.) or the like may be used, and an alkali oxide content thereof is 0.1% or less. The amorphous silicon film 2 is formed, for example, by a low pressure CVD process, and is deposited at a thickness of 500 angstroms.

The substrate 1 provided with the amorphous silicon film 2 is transferred from the left side to the right side in the drawing at a given velocity by a belt conveyor, general roller conveyor, or the like as a transfer means (although not shown in the drawing, the transfer direction is shown by an arrow 50) of a heat treatment apparatus 10.

In order to perform heat treatment to the amorphous silicon film 2 formed on the substrate 1, in the heat treatment apparatus 10 of this embodiment, a first heating system 3 (heating means) and a second heating system 4 (heat-treating means) are provided in a heat treatment apparatus body 11. The first heating system as a heating means preliminarily heats the substrate in the heating step. That is, it preheats the substrate. The second heating system as a heat-treating means heat-treats the thin film formed on the substrate in the heat-treating step.

The first heating system 3 is provided with a plurality of halogen lamps 3 as a light source of intermediate infrared rays 100. The first heating system 3 preheats the substrate 1 to a temperature of approximately 350° C. by irradiating the lower surface of the substrate 1 with intermediate infrared rays 100 with wavelengths of 2.5 μm to 5 μm from below the substrate 1 transferred.

The first heating system 3 may be configured in a plurality of blocks. Therefore, the intensity of irradiation of the intermediate infrared rays 100 can be varied by block.

The second heating system 4 is provided with a plurality of halogen lamps 4a as a light source. The light source is characterized by emitting near infrared rays 200 having wavelengths of 2.5 μm or less. At the rear of the halogen lamps 4a, a reflector 4b is provided for reflecting and linearly focusing the near infrared rays 200. The reflector has a concave surface.

Figure 2:
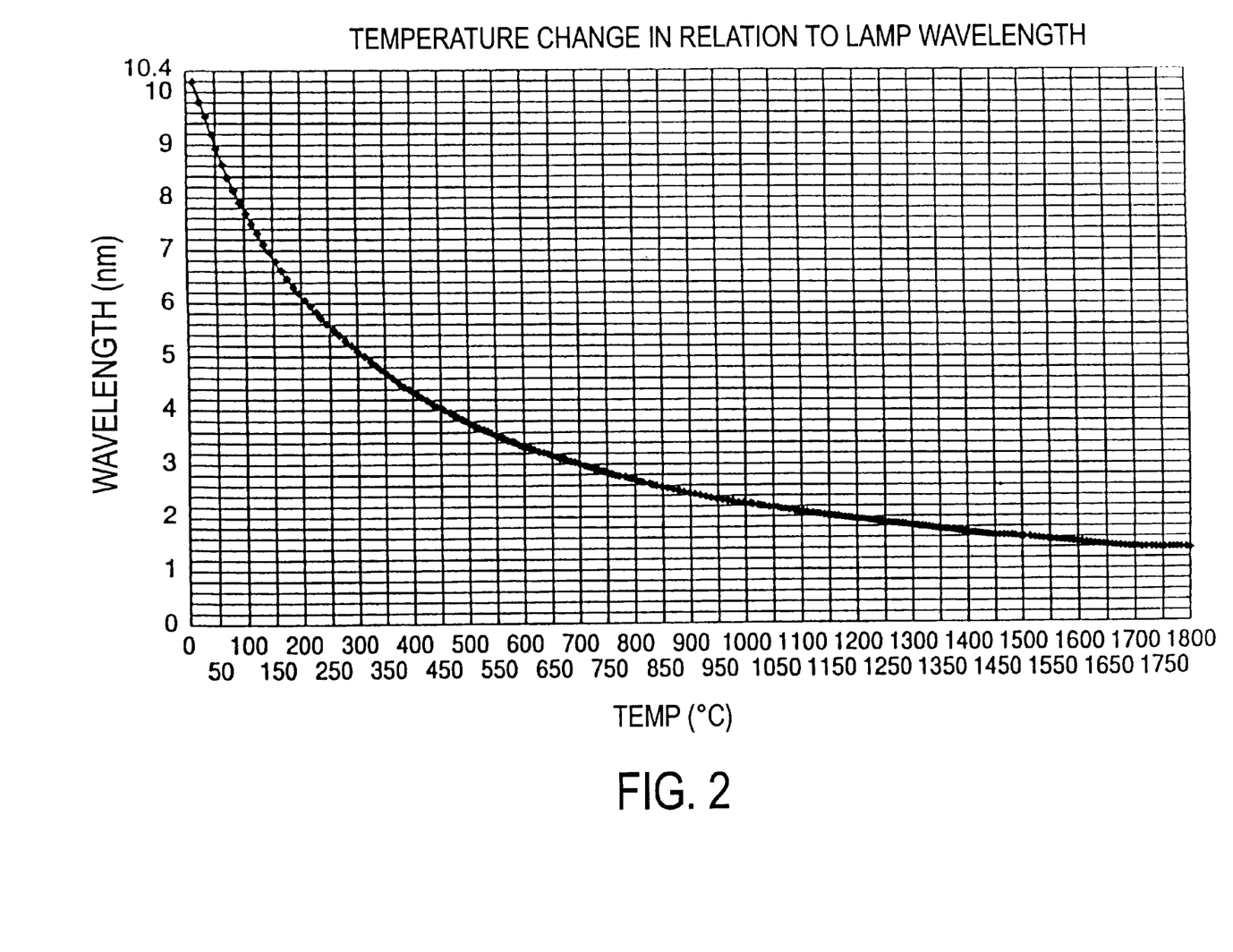
FIG. 2 is a graph which shows a relationship between the wavelength of the near infrared rays emitted from a halogen lamp used in the heat treatment apparatus shown in FIG. 1 and the substrate temperature.

The halogen lamp 4a has characteristics shown in FIGS. 2 and 3. FIG. 2 is a graph which shows a relationship between the wavelength (nm) of the near infrared rays 200 emitted from the halogen lamp 4a and the substrate temperature (° C.). As shown in the drawing, the graph shows how the substrate temperature changes in relation to the wavelength of the lamp. As shown in the drawing, even in a near infrared range, as the wavelength decreases, energy increases. In particular, it is clear from the graph that the substrate temperature reaches approximately 1,800° C. at a wavelength of 1.4 nm.

Figure 3A:
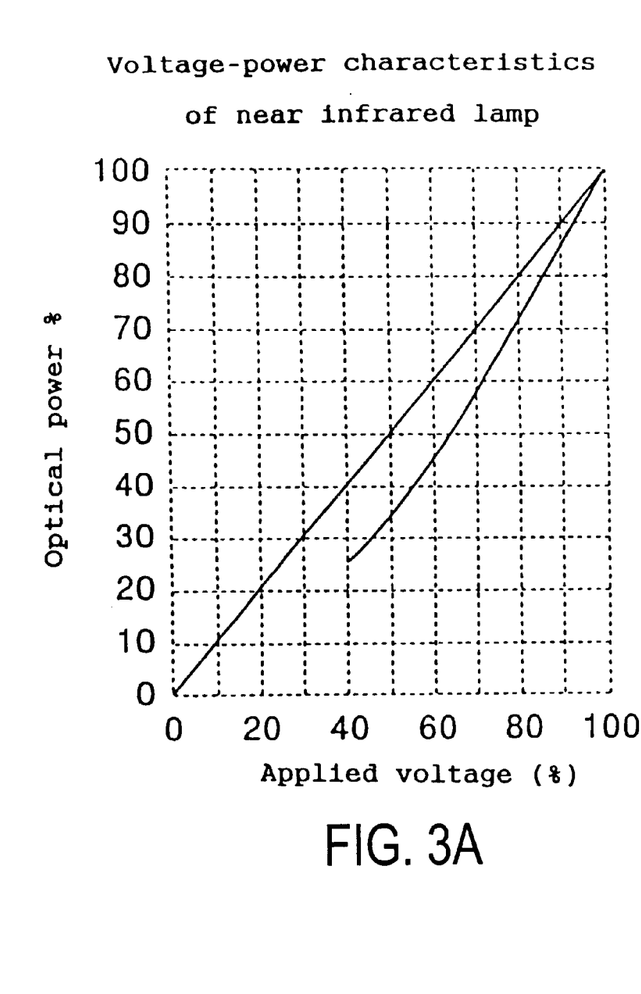
FIGS. 3(a) and 3(b) are a graph which shows voltage-output characteristics of a near infrared lamp used in the heat treatment apparatus shown in FIG. 1, and a graph which shows voltage-coil temperature characteristics of the near infrared lamp, respectively.

FIG. 3(a) is a graph which shows applied voltage-optical power characteristics of the halogen lamp 4a. It is clear from the graph that by changing the voltage in the range of from 40% to 100%, the power of the lamp (maximum power: 7,500 W in the embodiment) can be controlled in a range of from 25% to 100% of the maximum optical power.

Figure 3B:
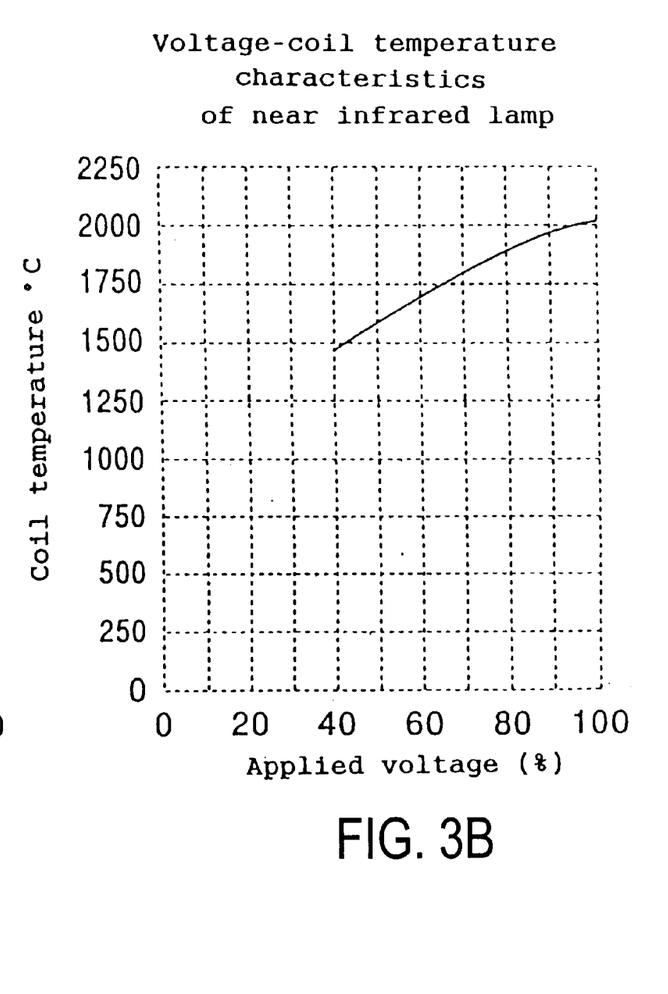

FIG. 3(b) is a graph which shows applied voltage-coil temperature characteristics of the halogen lamp 4a, and it is clear that by changing the applied voltage in a range of from 40% to 100% within a tolerance, the coil temperature of the lamp can be controlled in a range of from 1,500° C. to 2,000° C. Furthermore, experiments by the present inventors confirm that the coil temperature (1,500 to 2,000° C.) corresponds to the substrate temperature (600 to 800° C.). Thus, the variable control of an applied voltage in a range of from 40% to 100% enables the control of the substrate temperature in the range described above.

The steps of heat-treating the amorphous silicon film 2 formed on the substrate 1 in a method for fabricating a semiconductor device will be described briefly, in which the heat treatment apparatus in accordance with Embodiment 1 is used.

First, in FIG. 1(a), electric power is supplied to a plurality of halogen lamps 3a as the light source of the intermediate infrared rays 100 to drive the first heating system 3. The intensity of the intermediate infrared rays 100 emitted from the halogen lamp 3a is preliminarily set so that the entire substrate 1 is heated to approximately 350° C. in response to the transfer velocity of the substrate, the area of the substrate, etc. Alternatively, by providing a temperature measuring means for measuring the temperature of the substrate 1, the intensity of the intermediate infrared rays 100 is appropriately controlled in real time so as to heat the entire substrate 1 to approximately 350° C. based on the measurement results by the temperature measuring means.

At the same time, an electric power is supplied to the halogen lamp 4a as the light source of the near infrared rays 200 to drive the second heating system 4. The intensity of the near infrared rays 200 emitted from the halogen lamp 4a is preliminarily set so that the amorphous silicon film 2 is heated to 800 to 1,000° C. in response to the transfer velocity of the substrate, the area of the substrate, etc. Alternatively, by providing a temperature measuring means for measuring the temperature of the surface of the substrate 1, the applied voltage of the halogen lamp 4a may be controlled in a range of from 40% to 100% so that the amorphous silicon film 2 is heated to a predetermined temperature of 800 to 1,000° C. (800° C. in this embodiment).

Next, the transfer means is driven to start the transfer of the substrate 1, for example, at a velocity of 2.5 mm/sec, from the left side to the right side in FIG. 1.

As a result, the lower surface of the substrate 1 is irradiated with the intermediate infrared rays 100 emitted from the individual halogen lamps 3a of the first heating system 3. Thus, the substrate 1 composed of non-alkaline glass is heated, by absorbing the intermediate infrared rays 100, to approximately 350° C. before heat treatment to the upper surface of the substrate by the second heating system 4 is started (heating step/preliminary heating step).

When the heated substrate 1 is continuously fed in the heating step and is transferred to the position in which heating is performed by the second heating system 4, the amorphous silicon film 2 formed on the substrate 1 is irradiated with the near infrared rays 200 emitted from the halogen lamp 4a of the second heating system 4. The surface of the substrate is continuously irradiated with rays emitted from the halogen lamp in the condition that the rays are being linearly focused by the reflector 4b (heat-treating step).

Accordingly, as shown in FIG. 1(b), the amorphous silicon film 2 is heated, by absorbing the near infrared rays 200, to approximately 800° C. Thus, the amorphous silicon film 2 is ordered into a lattice state with a given depth from the surface of the film and is crystallized into polycrystalline silicon.

In such a manner, in the present invention, since the substrate 1 is preheated to 350° C. by the heating system before the heat treatment when the amorphous silicon film 2 is crystallized into the polycrystalline silicon, and thereby thermal stresses can be effectively prevented from occurring during recrystallization. Thus, in the present invention, since the occurrence of crystal defects or the like due to thermal stresses is greatly reduced, the substantial crystallization rate from amorphous silicon into polysilicon can be increased. Therefore, in the present invention, characteristics of thin film transistors or the like formed using polysilicon films can be further improved.

Figure 4:
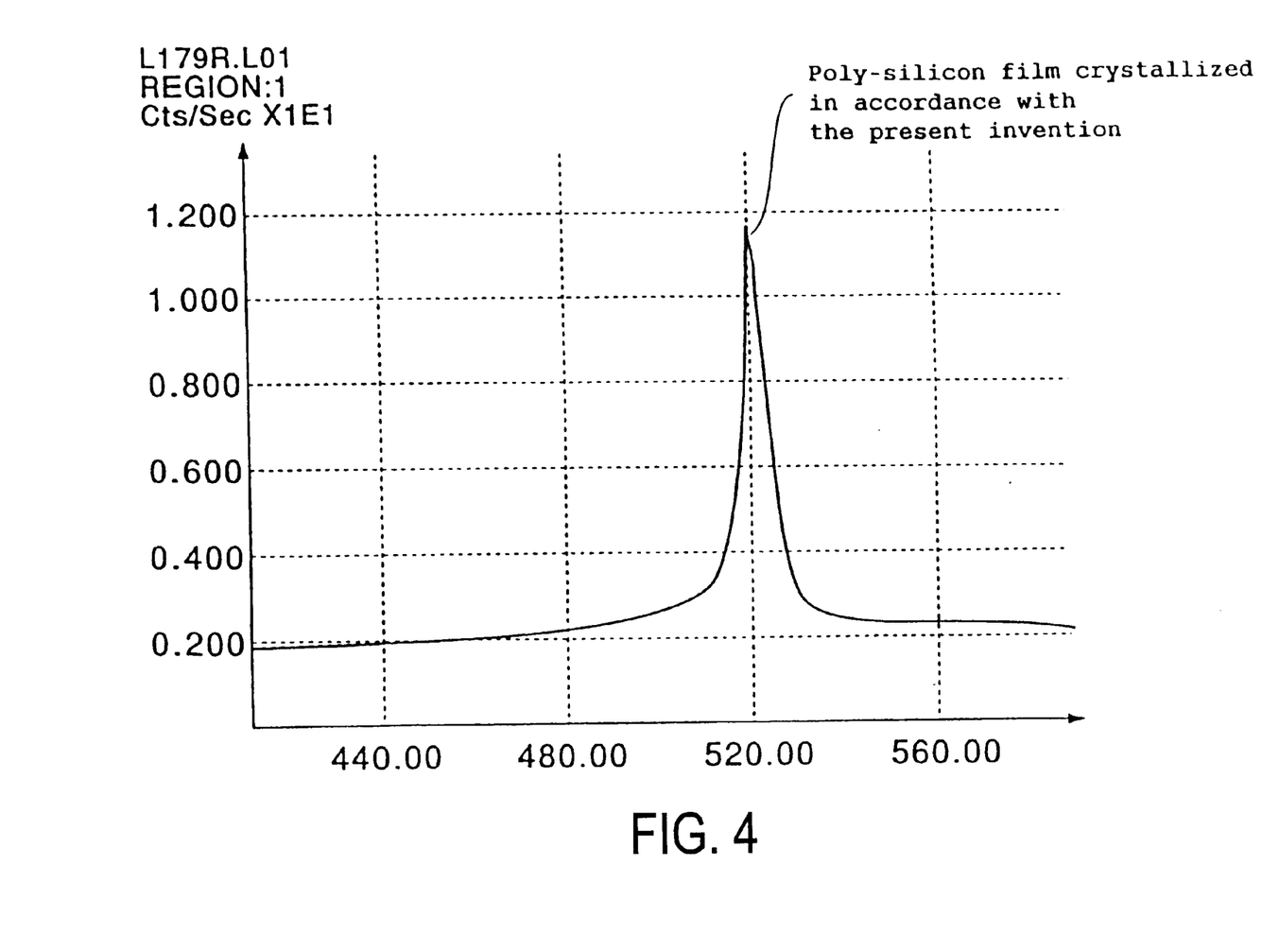
FIG. 4 is a graph which shows the analysis results, by means of Raman spectroscopy, of a polysilicon film crystallized using the heat-treating method in accordance with the first embodiment of the present invention.

FIG. 4 is a graph which shows the analysis results, by means of Raman spectroscopy, of a film which is formed by recrystallizing amorphous silicon into polysilicon in the process as described above. As shown in the graph, the Raman spectrum has a peak at a wavelength of 520.00 (cm$^{-1}$). In comparison with the analysis results of a normally crystallized polysilicon (Poly-Si) previously shown in FIG. 9 and the analysis results of a polysilicon film which has been crystallized by laser annealing shown in FIG. 10, the occurrence of the peak in FIG. 4 is closely analogous to that in the graph (FIG. 9) of the normally crystallized polysilicon. Therefore, the drawings show that the poly-crystallized silicon from amorphous silicon using the heat-treating method as described above has a higher crystallization rate in comparison with the case when crystallization is performed by a laser annealing method.

By using the fabrication method in accordance with the present invention, that is, the heat-treating method as described above, thermal stresses are suppressed. Thus, since strains such as shrinkage can be prevented from occurring in the polysilicon film, warpage, cracking, or the like can be avoided in the substrate 1. Furthermore, when an active matrix substrate as an example of a semiconductor device is fabricated using the substrate 1, the yield can be improved, resulting in decrease in cost of the liquid crystal panel.

Additionally, as shown in FIG. 1(a), in this embodiment, even after the heat treatment by the second heating system 4 is completed, heating by the intermediate infrared rays 100 continues by means of the first heating system 3 located on the downstream side (the right side in the drawing) of the second heating system 4. Thus, after the heat treatment by the second heating system 4, the substrate 1 can be cooled slowly. Therefore, since the polysilicon film converted from the amorphous silicon film 2 also can be cooled slowly, thermal stresses occurring in the polysilicon film can be further reduced in accordance with the method for fabricating semiconductor devices of the present invention.

Embodiment 2

A second embodiment of the present invention will be described with reference to FIG. 5.

Figure 5A:
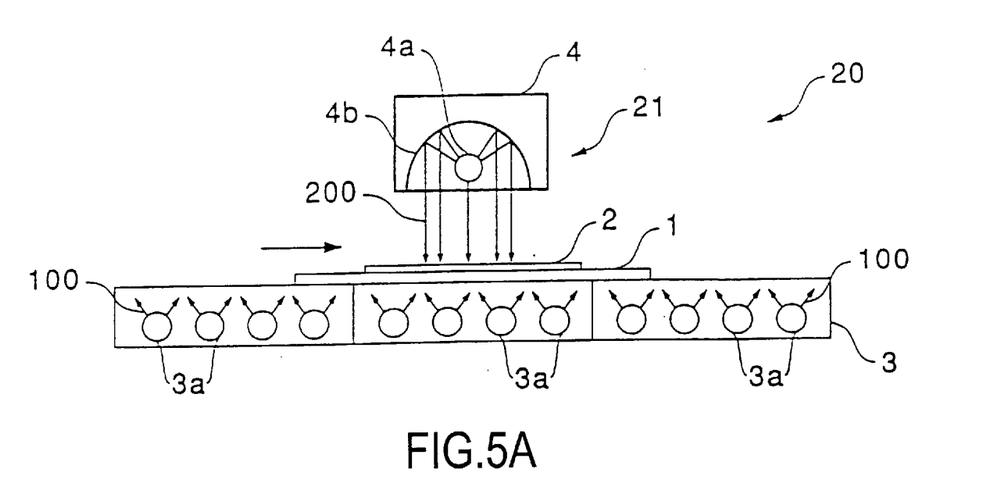
FIGS. 5(a) and 5(b) are a schematic diagram of a heat treatment apparatus used for performing a heat-treating method in accordance with a second embodiment of the present invention, and a graph which shows a relationship between the heating temperature and time in the heat treatment apparatus, respectively.
Figure 5B:
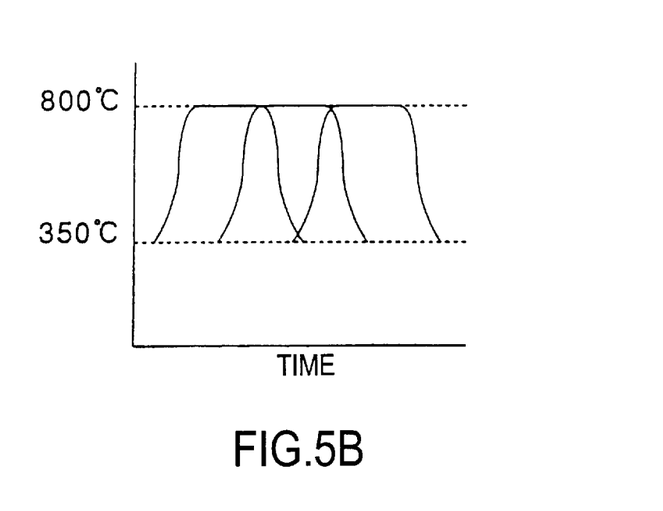

FIG. 5(a) is a schematic diagram of a heat treatment apparatus for performing a method for fabricating semiconductor devices (method for heat-treating) in accordance with the second embodiment of the present invention, and FIG. 5(b) is a graph which shows a relationship between the heating temperature and time in the heat treatment apparatus. Since the heat treatment apparatus in this embodiment basically has the same configuration as that of the heat treatment apparatus in Embodiment 1, the corresponding members are represented by the same numerals, and detailed descriptions thereof will be omitted.

In FIG. 5(a), a heat treatment apparatus body 21 in a heat treatment apparatus 20 in accordance with this embodiment includes a first heating system 3 (heating means) and a second heating system 4 (heat-treating means).

The first heating system 3 is provided with a plurality of halogen lamps 3a as a light source in a manner similar to that in Embodiment 1. The halogen lamp is characterized by emitting intermediate infrared rays 100. The heating system heats a substrate 1 to approximately 350° C. That is, the substrate 1 transferred by a transfer means (not shown in the drawing) is preheated to 350° C. by the heating system in which the lower surface of the substrate 1 is irradiated with intermediate infrared rays 100 having wavelengths of 2.5 to 5 μm. Additionally, since the first heating system 3 may be broken into a plurality of blocks, the intensity of irradiation of the intermediate infrared rays 100 can be varied by block.

A halogen lamp 4a as a light source is provided in the second heating system 4. The light source is characterized by emitting near infrared rays 200 having wavelengths of 2.5 μm or less. At the rear of the halogen lamp 4a, a reflector 4b for reflecting and collimating near infrared rays 200 emitted from the light source is formed. The reflector has concave surface, and the concavity collimates the near infrared rays.

The halogen lamp 4a has the same characteristics as those in Embodiment 1, and by variably controlling the applied voltage in a range of from 40% to 100%, the temperature of the substrate can be controlled in a range of from 600° C. to 800° C.

The steps of heat-treating the amorphous silicon film 2 formed on the substrate 1 in a method for fabricating a semiconductor device will be described briefly, in which the heat treatment apparatus in accordance with Embodiment 2 having a configuration as described above is used.

First, electric power is supplied to a plurality of halogen lamps 3a as the light source of intermediate infrared rays 100 to drive the heating system. The intensity of the intermediate infrared rays 100 emitted from the halogen lamp 3a is preliminarily set so that the entire substrate 1 is heated to approximately 350° C. in response to the transfer velocity of the substrate, the area of the substrate, etc. Alternatively, by providing a temperature measuring means for measuring the temperature of the substrate 1, the intensity of the intermediate infrared rays 100 emitted from the halogen lamp 3a may be variably controlled appropriately in real time so as to heat the entire substrate 1 to approximately 350° C. based on the measurement results by the temperature measuring means.

At the same time, electric power is supplied to the halogen lamp 4a as the source of the near infrared rays 200 to drive the second heating system 4. The intensity of the near infrared rays 200 emitted from the halogen lamp 4a is preliminarily set so that the amorphous silicon film 2 is heated to 800 to 1,000° C. in response to the transfer velocity of the substrate, the area of the substrate, etc. Alternatively, by providing a temperature measuring means for measuring the temperature of the surface of the substrate 1, an applied voltage to the halogen lamp 4a may be variably controlled in a range of from 40% to 100% so that the amorphous silicon film 2 is heated to a predetermined temperature of 800 to 1,000° C. (800° C. in this embodiment).

Next, a transfer means is driven to transfer the substrate 1, for example, at a velocity of 2.5 mm/sec. from the upstream side to the downstream side (from the left side to the right side in FIG. 5(a)).

As a result, the lower surface of the substrate 1 is irradiated with the intermediate infrared rays 100 emitted from the individual halogen lamps 3a of the first heating system 3. Thus, the substrate 1 composed of non-alkaline glass is heated by absorbing the intermediate infrared rays 100 to approximately 350° C. before heat treatment to the upper surface of the substrate by the second heating system 4 is started (heating step).

When the heated substrate 1 is continuously fed in the heating step and is transferred to the second heating system 4, the amorphous silicon film 2 formed on the substrate 1 is continuously irradiated with the near infrared rays 200 which have been emitted from the halogen lamp 4a of the second heating system 4 and collimated by the reflector 4b (heat-treating step).

Therefore, as shown in FIG. 5(b), the amorphous silicon film 2 is heated by absorbing the near infrared rays 200 to approximately 800° C. Thus, the amorphous silicon film 2 is ordered into a lattice state with a given depth from the surface of the film and is crystallized into polycrystalline silicon.

Accordingly, as in the case of Embodiment 1, since thermal stresses can be effectively prevented from occurring in the silicon film during recrystallization, the occurrence of crystal defects or the like due to thermal stresses can be greatly reduced. Since the suppression of thermal stresses can also prevent strains such as shrinkage from occurring in the polysilicon film, warpage, cracking, or the like can be avoided in the glass substrate 1.

In this embodiment also, as shown in FIG. 5(a), even after the heat treatment by the second heating system 4 is completed, heating by the intermediate infrared rays 100 continues by means of the first heating system 3 located on the downstream side (the right side in FIG. 5(a)) of the second heating system 4. Thus, thermal stresses occurring in the polysilicon film can be further reduced.

Embodiment 3

A third embodiment of the present invention will be described with reference to FIG. 6.

Figure 6A:
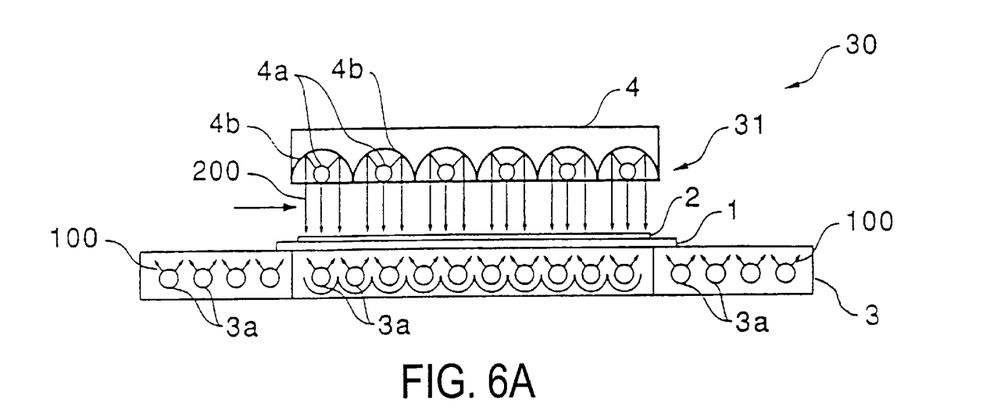
FIGS. 6(a), 6(b), and 6(c) are a schematic diagram of a heat treatment apparatus used for performing a heat-treating method in accordance with a third embodiment of the present invention, a graph which shows a relationship between the heating temperature and time in the heat treatment apparatus, and a timing chart, respectively.
Figure 6B:
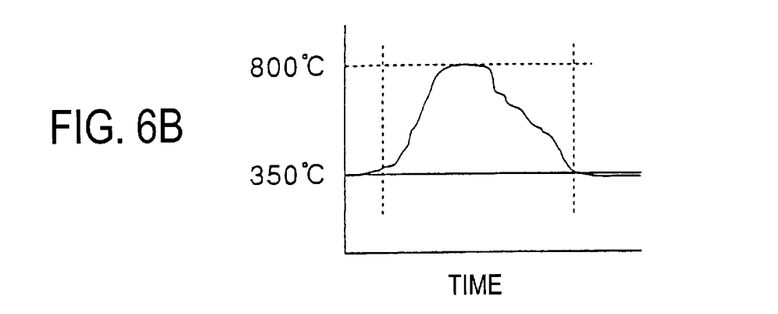
Figure 6C:
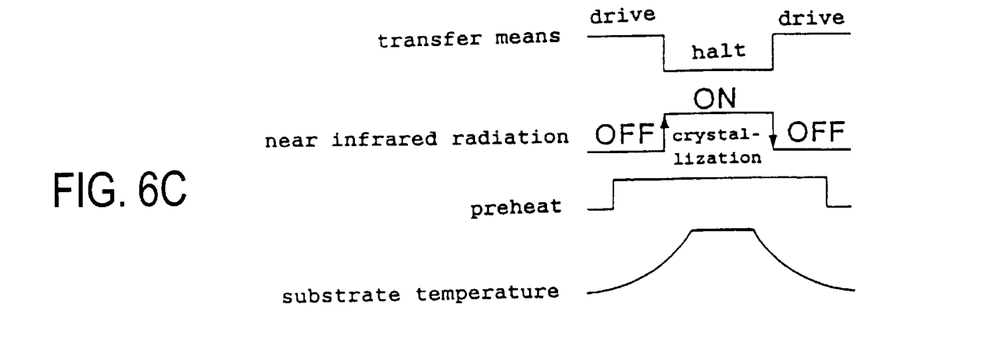

FIG. 6(a) is a schematic diagram of a heat treatment apparatus for performing a heat-treating method in accordance with the third embodiment of the present invention, FIG. 6(b) is a graph which shows a relationship between the heating temperature and time in the heat treatment apparatus, and FIG. 6(c) is a timing chart for heat treating in the heat treatment apparatus. Since the heat treatment apparatus in this embodiment also basically has the same structure as that of the heat treatment apparatus in Embodiment 1 or in Embodiment 2, the corresponding members are represented by the same numerals and detailed descriptions thereof will be omitted.

In FIG. 6(a), a heat treatment apparatus body 31 in a heat treatment apparatus 30 in accordance with this embodiment includes a first heating system 3 (heating means) and a second heating system 4 (heat-treating means).

The first heating system 3 is provided with a plurality of halogen lamps 3a as a source of intermediate infrared rays 100 in a manner similar to that in Embodiment 1 or Embodiment 2. The halogen lamps are structured so that a substrate 1 placed on the first heating system 3 is irradiated with intermediate infrared rays. The halogen lamps emit the intermediate infrared rays 100 having wavelengths of 2.5 to 5 μm to heat the substrate 1 to approximately 350° C. Additionally, the first heating system 3 may be broken into a plurality of blocks. In such a case, the intensity of irradiation of the intermediate infrared rays 100 may be varied by block.

In the second heating system 4, a light source including a plurality of halogen lamps 4a is formed. The light source is characterized by emitting near infrared rays 200 having wavelengths of 2.5 μm or less. In the periphery of the halogen lamps 4a, a reflector 4b having concavities for reflecting and collimating the near infrared rays 200 is provided. In this embodiment, since the entire amorphous silicon film 2 formed on the substrate 1 is collectively irradiated with the near infrared rays 200, the size of the second heating system 4 and the number of halogen lamps 4a to be provided are determined depending on the area, etc., of the substrate 1 to be heat-treated.

The characteristics of the halogen lamp 4a are the same as those in Embodiment 1 and Embodiment 2, and by variably controlling an applied voltage in a range of from 40% to 100%, the substrate temperature can be adjusted within a range of from 600° C. to 800° C.

The steps of heat-treating the amorphous silicon film 2 formed on the substrate 1 in a method for fabricating a semiconductor device will be described briefly, in which the heat treatment apparatus in accordance with Embodiment 3 configured as described above is used.

First, electric power is supplied to a plurality of halogen lamps 3a to drive the first heating system 3. The intensity of the intermediate infrared rays 100 emitted from the halogen lamp 3a is preliminarily set so that the entire substrate 1 is heated to approximately 350° C. in correspondence with the transfer velocity of the substrate, the area of the substrate, etc. Alternatively, by providing a temperature measuring means for measuring the temperature of the substrate 1, the intensity of the intermediate infrared rays 100 emitted from the halogen lamp 3a may be variably controlled appropriately in real time so as to heat the entire substrate 1 to approximately 350° C. based on the measurement results by the temperature measuring means.

Next, a transfer means is driven to transfer the substrate 1 to the second heating system 4, and the lower surface of the substrate 1 is irradiated with the intermediate infrared rays 100 emitted from the individual halogen lamps 3a of the first heating system 3. Accordingly, as shown in FIG. 6(b), the substrate 1 composed of non-alkaline glass is heated by absorbing the intermediate infrared rays 100 to approximately 350° C. before heat treatment to the upper surface of the substrate by the second heating system 4 is started (heating step).

As shown in FIG. 6(c), the transfer means is halted for a predetermined period of time when the entire substrate 1 is transferred to the position right under the second heating system 4.

At this stage, as shown in FIGS. 6(b) and (c), electric power is applied to the halogen lamps 4a to drive the second heating system 4. The entire amorphous silicon film 2 formed on the substrate 1 is collectively irradiated with the near infrared rays 200 which have been emitted from the halogen lamps 4a and collimated by the reflector 4b (heat-treating step).

Thus, the entire surface of the amorphous silicon film 2 is heated to 800° C. by absorbing the near infrared rays 200 as shown in FIG. 6(b). The amorphous silicon film 2 is ordered into a lattice state with a given depth from the surface of the film and is crystallized into polycrystalline silicon.

The intensity of the near infrared rays 200 emitted from the halogen lamps 4a is preliminarily set so that the entire surface of the amorphous silicon film 2 is heated to 800 to 1,000° C. in response to the area of the substrate, etc. Alternatively, by providing a temperature measuring means for measuring the temperature of the surface of the substrate 1, an applied voltage to the halogen lamps 4a may be variably controlled in a range of from 40% to 100% so that the amorphous silicon film 2 is heated to a given temperature of 800 to 1000° C. (800° C. in this embodiment).

Then, as shown in FIG. 6(c), after the predetermined period of time, the electric power supply to the halogen lamps 4a is halted and the transfer means is driven again to carry the substrate 1 which has been subjected to heat treatment.

Thus, as in the case of Embodiment 1 or Embodiment 2, since thermal stresses can be effectively prevented from occurring in the silicon film during crystallization, the occurrence of crystal defects or the like due to thermal stresses can be greatly reduced. Since thermal stresses are suppressed and strains such as shrinkage can be prevented from occurring in the polysilicon film in accordance with the present invention, warpage, cracking, or the like can be avoided in the glass substrate 1.

As shown in FIG. 6(a), even after the heat treatment by the second heating system 4 is completed, heating by the intermediate infrared rays 100 continues by means of the first heating system 3 located on the downstream side (the right side in FIG. 6(a)) of the second heating system 4. Thus, the polysilicon film can be cooled slowly. Therefore, the occurrence of thermal stresses can be further reduced.

Embodiment 4

A fourth embodiment of the present invention will be described with reference to FIG. 7.

Figure 7:
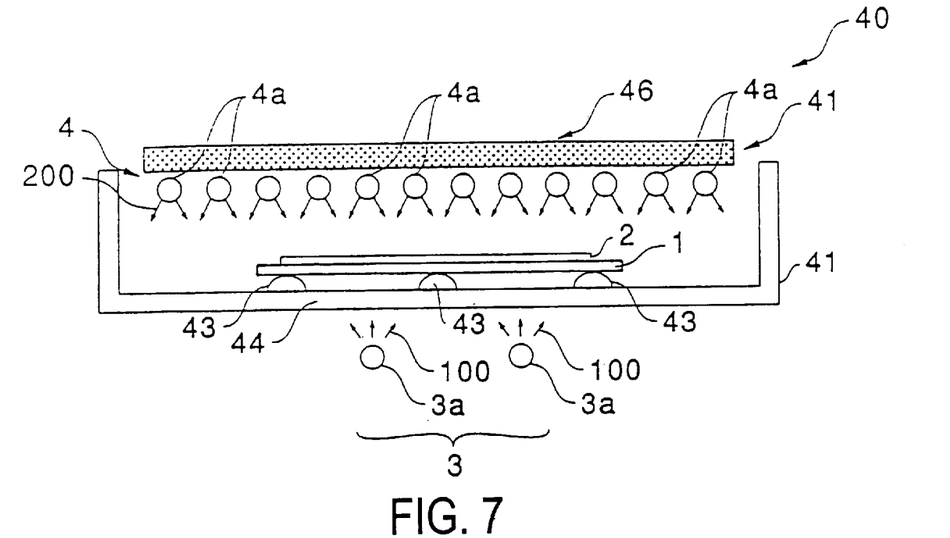
FIG. 7 is a schematic diagram of a heat treatment apparatus used for performing a heat-treating method in accordance with a fourth embodiment of the present invention.

FIG. 7 is a schematic sectional view which shows a heat treatment apparatus in accordance with the fourth embodiment of the present invention.

In FIG. 7, a heat treatment apparatus 40 in this embodiment includes a heat treatment case. A heat treatment case 41 also serves as a table 44 composed of a silica glass or ceramic for placing a substrate thereon.

Below the heat treatment case 41, two halogen lamps 3a are provided as a light source used as a heating system (heating means). The halogen lamps 3a emit intermediate infrared rays 100, which have a wavelength band of 2.5 to 5 μm and preheat a substrate 1 to approximately 350° C.

On the upper surface of the table 44, which corresponds to the bottom surface of the heat treatment case 41, a plurality of hemispherical spacers 43 (substrate-spacing means) composed of a heat-resistant material such as a ceramic are disposed. In this embodiment, the height of the spacers 43 is set, for example, at 1 mm.

The substrate 1 composed of non-alkaline glass is placed on the spacers 43. That is, the substrate 1 is retained while being separated from the bottom surface of the heat treatment case 1 (the upper surface of the table 44). As the substrate 1, for example, OA-2 (manufactured by Nippon Electric Glass Co., Ltd.) or the like may be used, and an alkali oxide content thereof is 0.1% or less. On the surface of the substrate 1, for example, an amorphous silicon film 2 as a semiconductor thin film is formed.

Above the heat treatment case 1, a plurality of halogen lamps 4a (heat-treating means) are provided so as to face the surface of the substrate 1. The halogen lamps 4a emit near infrared rays 200 having a wavelength band of 2.5 μm or less and a predetermined annealing process is performed by heating the substrate 1 to 800 to 1,000° C.

A water-cooling jacket 46 is provided above the halogen lamps 4a to prevent overheating.

The steps of heat-treating the amorphous silicon film 2 formed on the substrate 1 in a method for fabricating a semiconductor device will be described briefly, in which the heat treatment apparatus in accordance with Embodiment 4 having a structure described above is used.

First, electric power is supplied to the halogen lamps 3a and the lower surface of the substrate 1 is irradiated with the intermediate infrared rays 100 so that the substrate 1 is heated to approximately 350° C. (heating step).

At the same time, electric power is supplied to the halogen lamps 4a, and the amorphous silicon film formed on the substrate 1 is heated to, for example, approximately 800° C. by the near infrared rays 200 emitted from the halogen lamps 4a (heat-treating step).

Thus, the amorphous silicon film 2 is ordered into a lattice state with a given depth from the surface of the film and is crystallized into polycrystalline silicon.

In this embodiment, since the substrate 1 is separated from the bottom surface of the heat treatment case (the surface of the table 44) by ceramic spacers 43 during annealing as described above, even if warpage or deformation occurs in the table 44 due to heating by the first heating system 3 or the second heating system 4, the substrate 1 is prevented from being affected thereby.

Since heat from the first heating system 3 is not directly transferred to the substrate 1 through the bottom surface of the heat treatment case (table 44) by providing the ceramic spacers 43, deformation such as warpage due to overheating of the substrate 1 can be prevented. Therefore, since the non-defective substrate rate increases, costs of liquid crystal panels or the like which use the substrate 1 can be reduced.

Additionally, in this embodiment, since the substrate 1 is preheated to approximately 350° C. before the semiconductor thin film is annealed, thermal stresses can be prevented from occurring in the amorphous silicon film 2 during crystallization.

Embodiment 5

A fifth embodiment of the present invention will be described with reference to FIG. 8.

Figure 8:
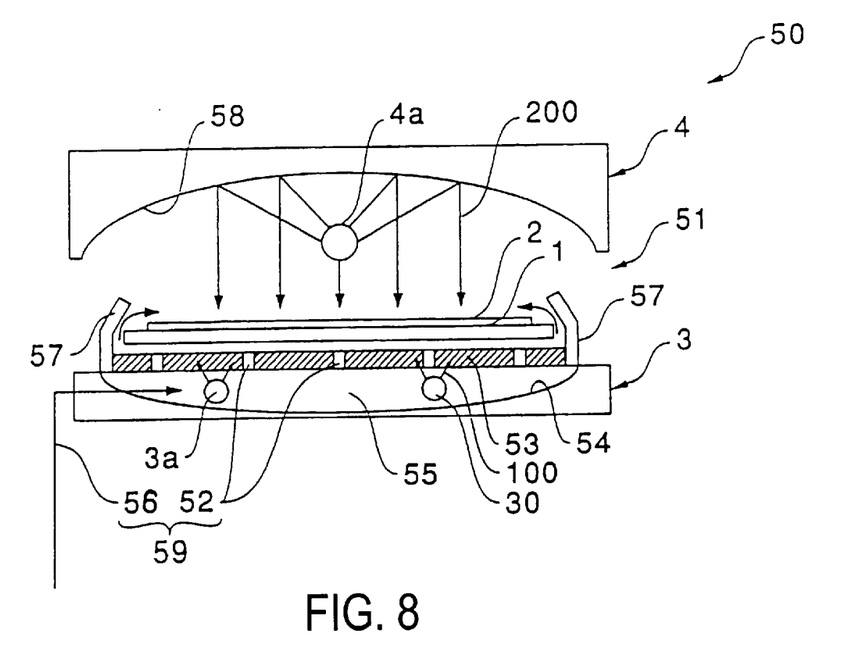
FIG. 8 is a schematic diagram of a heat treatment apparatus used for performing a heat-treating method in accordance with a fifth embodiment of the present invention.

FIG. 8 is a schematic sectional view which shows a heat treatment apparatus in accordance with the fifth embodiment. Since the heat treatment apparatus in this embodiment has basically the same structure as that of the heat treatment apparatus in Embodiment 4, corresponding members are represented by the same numerals and detailed descriptions thereof will be omitted.

In FIG. 8, a heat treatment apparatus body 51 in a heat treatment apparatus 50 in this embodiment includes a first heating system 3 (heating means) and a second heating system 4 (heat-treating means).

The first heating system 3 is provided with two halogen lamps 3a as a light source. The source emits intermediate infrared rays 100 having a wavelength band of 2.5 to 5 $\mu$m toward the lower surface of a substrate 1. The substrate 1 is heated to approximately 350° C.

A table 53 composed of silica glass is provided above the halogen lamps 3a. A plurality of gas nozzles 52 having a diameter of approximately 0.2 to 1 mm are provided on the table 53.

A reflector 54 is formed on the first heating system 3 for reflecting intermediate infrared rays 100 of the halogen lamps 3a. The reflector 54 is disposed below the halogen lamps 3a.

To a hollow section 55 formed by the reflector 54 and the table 53, a gas feed pipe 56 of a gas lifting unit 59 (substrate-spacing means) is connected. The gas feed pipe 56 is connected to a pump, a valve, etc. (not shown in the drawing).

In the heat treatment apparatus 50 structured as described above, in the gas lifting unit 59, when a gas is supplied from the gas feed pipe 56 at a given flow rate, the gas filled in the hollow section 55 jets from the gas nozzles 52 at a given pressure (e.g., 0.1 kg/cm$^2$ to 0.2 kg/cm$^2$), enabling the substrate 1 to be lifted by the pressure of the gas flow.

As the gas to be fed through the gas feed pipe 56, an inert gas such as helium, neon, or argon, N$_2$ gas, or water vapor gas may be selected depending on the purpose of annealing.

Furthermore, a guide vane 57 as a gas guidance means is formed on the end of the table 53. The guide vane 57 guides the gas flow, which escapes from the end of the substrate 1 after the substrate 1 is lifted, to the upper surface of the substrate 1.

A halogen lamp 4a is formed on the second heating system 4. The halogen lamp emits near infrared rays 200 having wavelengths of 2.5 $\mu$m or less. At the rear of the halogen lamp 4a, a reflector 58 is provided for reflecting and collimating the near infrared rays 200. The reflector has a concave surface.

The steps of heat-treating the amorphous silicon film 2 formed on the substrate 1 in a method for fabricating a semiconductor device will be described briefly, in which the heat treatment apparatus in accordance with Embodiment 5 having a structure described above is used.

First, a gas is fed to the gas feed pipe 56 and the gas is fed into the hollow section 55 of the first heating system 3 at a given flow rate. Consequently, the gas filled in the hollow section 55 jets out of the gas nozzles 52 of the table 53 as a gas flow at a given pressure (e.g., 0.1 to 0.2 kg/cm$^2$), and the substrate 1 is lifted by it and retained so as to be separated from the table 53.

Next, the first heating system 3 is driven. That is, electric power is supplied to the halogen lamps 3a as the source of the intermediate infrared rays 100, and the lower surface of the substrate 1 is irradiated with the intermediate infrared rays 100. In such a manner, the substrate is preliminarily heated to approximately 350° C. (heating step).

At this stage, the substrate 1 is lifted up from the surface of the table 53. That is, since the substrate 1 is separated from the surface of the table 53, even when the table 53 is warped or deformed due to heat from the halogen lamps 3a, the substrate 1 can be prevented from being affected thereby.

Since the substrate 1 is not brought into contact with the table 53, direct transfer of heat from the table 53 to the substrate 1 can be avoided. Therefore, the substrate 1 can be prevented from being warped or deformed due to overheating.

At the same time, the second heating system 4 is driven and electric power is supplied to the halogen lamp 4a as the source for the near infrared rays 200. Consequently, the amorphous silicon film on the substrate 1 is irradiated with the near infrared rays 200 which have been emitted from the halogen lamp 4a and collimated by the reflector 58 (heat-treating step).

As a result, the amorphous silicon film 2 on the substrate 1 is heated by absorbing the near infrared rays 200 and the temperature is raised to approximately 800° C. Thus, the amorphous silicon film 2 is ordered into a lattice state with a given depth from the surface of the film and is crystallized into polycrystalline silicon.

At this stage, when an inert gas or nitrogen gas is used as a gas for lifting the substrate 1, the gas flow jets out of the gas nozzles 52 and is then guided to the upper surface of the substrate 1 by the guide vane 57. Therefore, the surface of the substrate 1 can be covered with the inert gas or nitrogen gas.

Consequently, since the surface of the substrate 1 is prevented from being exposed to air or the like, the oxidation of the substrate 1 or silicon film can be prevented, and thus, good quality polycrystalline silicon can be obtained.

When water vapor gas is used as a gas for lifting the substrate 1, since water vapor gas can be guided to the surface of the substrate 1, for example, the substrate 1 itself or the silicon film formed on the surface of the substrate can be oxidized.

Therefore, by appropriately selecting the type of gas fed to the hollow section 55 of the first heating system 3 through the gas feed pipe 56, a plurality of heat-treating steps such as an annealing step in which oxidation is prevented and an oxidizing step can be performed by one heat treatment apparatus 50.

Additionally, if a gas jet unit is provided on the second heating apparatus 4 side as well, an annealing treatment in which oxidation is prevented more effectively or in which an oxide film is formed more efficiently is performed by feeding an inert gas, $N_2$ gas, or water vapor gas to the surface of the substrate 1 during annealing.

Other Embodiment

Although a non-alkaline glass substrate is used as a substrate in the embodiments described above, the invention is not limited to this and can also be applicable to other semiconductor substrates and insulating substrates.

The semiconductor thin film to be heat-treated in accordance with the present invention is not limited to an amorphous silicon film, and the invention is applicable to semiconductor thin films in general which are effectively activated by heat treatment. The invention is also applicable to annealing treatment of the surface of an ion-planted substrate, in addition to the semiconductor thin films.

As for a source for intermediate infrared rays in the first heating system 3, in addition to the halogen lamp, other intermediate infrared sources such as carbon heaters or lasers may be used.

Although, in the embodiments described above, when the intensity of irradiation on the substrate is controlled by changing the power of near infrared rays in the second heating system 4, as described with reference to FIG. 3, a voltage applied to the halogen lamp is changed, the invention is not limited to this. The wavelength of near infrared rays may be changed within a range of 1 μm to 2 μm by variably controlling the frequency of current applied to the halogen lamp 4*a*. Additionally, a relative distance between the halogen lamp 4*a* and the surface of the substrate 1 or the surface of the amorphous silicon film 2 (semiconductor thin film) formed on the substrate 1 may be variably controlled. For example, a mechanism for moving the first heating system 3 or the substrate 1 up and down may be provided.

Furthermore, the intensity of irradiation on the substrate 2 may be controlled by disposing a near infrared radiation scattering/reflecting means for reflecting or scattering near infrared rays emitted by the halogen lamp 3*a* of the first heating system 3 toward the surface of the substrate 2 or the semiconductor thin film formed on the substrate 2, or by disposing a near infrared radiation attenuating means for controlling the intensity of irradiation to the substrate by attenuating the near infrared rays.

In such a case, with respect to the near infrared radiation scattering/reflecting means, for example, a reflecting mirror may be provided such that the angle of reflection of near infrared rays emitted from the halogen lamp 3*a* of the first heating system 3 and directed toward the surface of the substrate 2 or the surface of the semiconductor thin film formed on the substrate 2 can be varied.

The near infrared radiation attenuating means may be disposed, for example, between the halogen lamp 3*a* of the first heating system 3 and the surface of the substrate 2, or between the halogen lamp 3*a* and the surface of the semiconductor thin film formed on the substrate 2. That is, the near infrared radiation attenuating means is disposed on the optical path of light emitted from the halogen lamp toward the substrate. The near infrared ray attenuating means may include a wavelength filter in which the range of the transmittable wavelength band of the near infrared rays can be continuously changed. The wavelength filter includes a quartz slit for transmitting near infrared rays and the width of the slit can be varied.

INDUSTRIAL APPLICABILITY

As described above, in a method for fabricating semiconductor devices and a heat treatment apparatus in accordance with the present invention, after a substrate is preheated by irradiating the substrate with intermediate infrared rays having a wavelength band of 2.5 to 5 μm, a semiconductor thin film is annealed at temperatures of 800 to 1,000° C. by irradiating the thin film with near infrared rays having a wavelength band of 2.5 μm or less, and thus, when an amorphous silicon film deposited on a non-alkaline glass substrate is subjected to heat treatment to crystallize into a polysilicon film, because of the preheating effect to the substrate, thermal stresses can be prevented from occurring in the annealed polysilicon film. Therefore, since crystal defects or the like resulting from thermal stresses do not occur, the crystallization rate from the amorphous silicon film into the polysilicon film can be increased. Since thermal stresses do not remain in the polysilicon film, the glass substrate is not warped or cracked, and the yield of active matrix substrates can be increased.

Furthermore, by performing heat treatment with a substrate being lifted from the surface of a table by a substrate-spacing means, the substrate can be prevented from being affected by the strains or deformations of the table. Additionally, since heat is not directly transferred from the surface of the table to the substrate itself, the substrate is effectively prevented from being warped or deformed due to high temperatures.

What is claimed is:

1. A method for fabricating a semiconductor device comprising:

heating a substrate to a specified temperature by irradiating the substrate from a side of one surface of the substrate with intermediate infrared rays having a wavelength band of 2.5 to 5 μm; and heat-treating a thin film formed on the substrate by irradiating the substrate from a side of another surface of the substrate with near infrared rays having a wavelength band of 2.5 μm or less in a state in which the specified temperature is maintained.

2. The method for fabricating a semiconductor device according to claim 1, a heating temperature in the heating step being in a range of from 300° C. to 450° C.

3. The method for fabricating a semiconductor device according to claim 1, a heating temperature in the heat-treating step being in a range of from 800° C. to 1,000° C.

4. The method for fabricating a semiconductor device according to claim 1, the near infrared rays being focused in the heat-treating step by an optical system for radiation to the substrate and the substrate being relatively moved at a velocity.

5. The method for fabricating a semiconductor device according to claim 1, the near infrared rays being collimated in the heat-treating step by an optical system for radiation to the substrate and the substrate being relatively moved at a velocity.

6. The method for fabricating a semiconductor device according to claim 1, the near infrared rays being collimated in the heat-treating step by an optical system further comprising substantially irradiating an entire region of the thin film formed on the substrate.

7. The method for fabricating a semiconductor device according to claim 1, in the heat-treating step, a light source which can change a wavelength of the near infrared rays within a range of from 1 $\mu$m to 2 $\mu$m being used.

8. The method for fabricating a semiconductor device according to claim 7, in the heat-treating step, the wavelength of the near infrared rays being controlled by changing a frequency of a current applied to the light source.

9. The method for fabricating a semiconductor device according to claim 1, in the heat-treating step, an intensity of irradiation of the near infrared rays to the substrate being controlled by changing an electric power applied to the light source.

10. The method for fabricating a semiconductor device according to claim 1, in the heat-treating step, an intensity of irradiation of the near infrared rays to the substrate being controlled by changing a relative distance between the light source and the substrate.

11. The method for fabricating a semiconductor device according to claim 1, in the heat-treating step, an intensity of irradiation of the near infrared rays to the substrate being controlled by scattering or reflecting the near infrared rays emitted from the light source to the substrate.

12. The method for fabricating a semiconductor device according to claim 1, in the heat-treating step, an intensity of irradiation of the near infrared rays to the substrate being controlled by changing an angle of reflection with a reflecting mirror for the near infrared rays emitted from the light source to the substrate.

13. The method for fabricating a semiconductor device according to claim 1, in the heat-treating step, an intensity of irradiation of the near infrared rays to the substrate being controlled by attenuating the near infrared rays emitted from the light source to the substrate.

14. The method for fabricating a semiconductor device according to claim 1, in the heat-treating step, an optical path wavelength filter being disposed between the light source and the substrate and an intensity of irradiation of the near infrared rays to the substrate being controlled by changing a transmission range of the near infrared rays in the wavelength filter.

15. The method for fabricating a semiconductor device according to claim 14, in the heat-treating step, a slit comprising quartz being used as the wavelength filter.

16. The method for fabricating a semiconductor device according to claim 1, at least one of the heating step and the heat-treating step further comprising separating the substrate a distance from a surface of a table on which the substrate is initially placed.

17. The method for fabricating a semiconductor device according to claim 1, the substrate being a non-alkaline glass substrate and the semiconductor thin film being an amorphous silicon thin film.

* * * * *